(12) United States Patent
Asuke

(10) Patent No.: US 7,353,623 B2
(45) Date of Patent: Apr. 8, 2008

(54) SOLVENT REMOVAL APPARATUS AND METHOD

(75) Inventor: Shintaro Asuke, Suwa (JP)

(73) Assignee: Seiko Epson Corporation (JP)

( * ) Notice: Subject to any disclaimer, the term of this patent is extended or adjusted under 35 U.S.C. 154(b) by 37 days.

(21) Appl. No.: 11/312,970

(22) Filed: Dec. 20, 2005

(65) Prior Publication Data
US 2006/0137213 A1    Jun. 29, 2006

(30) Foreign Application Priority Data
Dec. 24, 2004    (JP) .............................. 2004-374494

(51) Int. Cl.
*F26B 7/00*    (2006.01)
(52) U.S. Cl. ........................................... 34/381; 34/80
(58) Field of Classification Search ................. 34/380, 34/443, 381, 77, 78, 80, 90; 134/902; 118/52; 427/240; 347/45
See application file for complete search history.

(56) References Cited

U.S. PATENT DOCUMENTS

| | | | | |
|---|---|---|---|---|
| 3,791,342 A | * | 2/1974 | Boyer et al. | 118/52 |
| 3,950,184 A | * | 4/1976 | Adams et al. | 134/10 |
| 4,510,176 A | * | 4/1985 | Cuthbert et al. | 438/780 |
| 4,790,262 A | * | 12/1988 | Nakayama et al. | 118/52 |
| 5,803,970 A | * | 9/1998 | Tateyama et al. | 118/319 |
| 5,952,050 A | * | 9/1999 | Doan | 427/336 |

FOREIGN PATENT DOCUMENTS

| | | |
|---|---|---|
| JP | 07-111232 | 4/1995 |
| JP | 08-194316 | 7/1996 |
| JP | 2000-124106 | 4/2000 |
| JP | 2003-262464 | 9/2003 |
| JP | 2003-275668 | 9/2003 |

* cited by examiner

*Primary Examiner*—S. Gravini
(74) *Attorney, Agent, or Firm*—Harness, Dickey & Pierce, P.L.C.

(57) ABSTRACT

A solvent removal apparatus and method is provided that can dry a coat on a workpiece in a uniform thickness. The solvent removal apparatus includes a support base for supporting a substrate provided with a liquid phase film-forming coat containing a film material and a solvent, a gas introduction mechanism for introducing a solvent removal gas toward a center part of the substrate, and a flow restrictor for restricting flow of the solvent removal gas in such a manner that the gas can flow radially outward from the center part of the substrate toward a peripheral edge part thereof. The solvent is removed from the coat while restricting the flow of the gas with the flow restrictor.

22 Claims, 7 Drawing Sheets

SOLVENT REMOVAL APPARATUS AND METHOD

CROSS-REFERENCE

The entire disclosure of Japanese Patent Application No. 2004-374494 filed on Dec. 24, 2004 is expressly incorporated by reference herein.

BACKGROUND OF THE INVENTION

1. Field of the Invention

The present invention is directed to an apparatus and method for removing a solvent.

2. Description of the Prior Art

The technique of forming a thin film of uniform thickness, e.g., a photoresist film, on a substrate is the knowledge of public domain. In the process of forming the thin film, a need exists to dry a coat deposited on the substrate. One known method for drying the coat is to heat up the coat as a whole.

This conventional method is, however, disadvantageous in that a solvent (liquid) contained in the coat goes rapidly vaporized from the surface of the coat, thus creating a density difference between the surface and the interior of the coat and reducing, by convection, the surface flatness of the film acquired.

Furthermore, the film thus acquired shows poor thickness distribution due to the insufficiency of flowage-caused self-leveling action. Particularly, because the drying speed at a peripheral edge of the substrate is faster than at the center thereof, the film exhibits increased thickness difference between the center part and the peripheral edge part (marginal end part). In addition, the afore-mentioned method poses a problem in that the uniformity of components in a liquid film material is decreased to thereby bring about instability in the film quality.

Another known method for drying the coat is to extinguish the flowability of the coat by baking (thermally treating) a liquid material coated on a substrate under a vacuum condition. Reference is made to, for example, JP-A No. 8-194316. In this prior art method, however, the solvent is dried abruptly at a high vacuum degree, which may unintentionally change the properties of a resist material and roughen the surface of the thin film produced.

SUMMARY OF THE INVENTION

Accordingly, it is an object of the present invention to provide a solvent removal apparatus and method that can make uniform the thickness of a coat provided on a workpiece.

In one aspect of the present invention, there is provided a solvent removal apparatus, comprising: a workpiece support means for supporting a workpiece provided with a liquid phase film-forming coat containing a film material and a solvent; a gas introduction means for introducing a solvent removal gas toward a center part of the workpiece; and a restriction means for restricting flow of the solvent removal gas in such a manner that the solvent removal gas can flow radially outward from the center part of the workpiece toward a peripheral edge part, whereby the solvent is removed from the coat while restricting the flow of the solvent removal gas with the restriction means.

According to the present invention described above, it is possible to make uniform the thickness of the coat provided on the workpiece.

In the solvent removal apparatus of the present invention, it is preferred that the restriction means comprise a confronting plate having an opening through which the solvent removal gas is introduced from the gas introduction means, the confronting plate disposed in a confronting relationship with the workpiece so that the solvent removal gas can flow through a flow passageway formed between the confronting plate and the workpiece.

This makes it possible to urge the gases to flow from the center part toward the peripheral edge part in an easy and positive manner.

In the solvent removal apparatus of the present invention, it is preferred that the confronting plate be configured to cover the workpiece, when viewed from the top of the apparatus.

This makes it possible to assist in distributing the gases on the entire surface of the workpiece.

In the solvent removal apparatus of the present invention, it is preferred that the restriction means comprise a flow accelerating means for facilitating the radial gas flow by augmenting a pressure differential between the center part and the peripheral edge part of the workpiece.

This can create the gas flow with an increased certainty.

In the solvent removal apparatus of the present invention, it is preferred that the solvent removal gas introduced toward the center part of the workpiece contains a mixed-in solvent.

This helps to prevent the coat from over-drying particularly in the center part of the workpiece.

In the solvent removal apparatus of the present invention, it is preferred that the apparatus further comprise: a detecting means for detecting solvent concentration in the solvent removal gas at a predetermined position between the center part and the peripheral edge part of the workpiece; and a flow rate regulating means responsive to the result of detection in the detecting means for regulating flow rate of the solvent removal gas introduced toward the center part of the workpiece.

This makes it possible to detect the solvent concentration in the gases and thereby regulate the flow rate of the gases.

In the solvent removal apparatus of the present invention, it is preferred that the flow rate regulating means be adapted to regulate the flow rate of the solvent removal gas introduced toward the center part of the workpiece in such a manner that the solvent removal gas is supplied in a greatest possible quantity to keep themselves saturated with a vaporized in-coat solvent removed from the coat, when arrived at the peripheral edge part of the workpiece.

This improves the efficiency of using the solvent removal gas.

In the solvent removal apparatus of the present invention, it is preferred that the apparatus further comprise: a detecting means for detecting solvent concentration in the solvent removal gas at a predetermined position between the center part and the peripheral edge part of the workpiece; and a ratio regulating means responsive to the result of detection in the detecting means for regulating ratio of the mixed-in solvent in the solvent removal gas introduced toward the center part of the workpiece.

This makes it possible to detect the solvent concentration in the gases and thereby regulate the ratio of the mixed-in solvent in the solvent removal gas.

In the solvent removal apparatus of the present invention, it is preferred that the ratio regulating means be adapted to regulate the ratio of the mixed-in solvent in the solvent removal gas introduced toward the center part of the workpiece in such a manner that, when arrived at the peripheral edge part of the workpiece, the solvent removal gas is converted from a condition not yet saturated with the vaporized in-coat solvent to a condition fully saturated with the vaporized in-coat solvent.

This improves the efficiency of using the solvent.

In the solvent removal apparatus of the present invention, it is preferred that the detecting means be adapted to detect the solvent concentration in the solvent removal gas at a position in the vicinity of the peripheral edge part of the workpiece.

This makes it possible to detect the solvent concentration in the gases flowing in the vicinity of the peripheral edge part of the workpiece.

In the solvent removal apparatus of the present invention, it is preferred that the apparatus further comprise a chamber for accommodating the workpiece and for controlling an atmospheric condition within the chamber.

This makes it possible to maintain the atmosphere or environment around the workpiece in a desired one, thus ensuring that the workpiece with a thin film of uniform thickness can be produced.

In the solvent removal apparatus of the present invention, it is preferred that the apparatus further comprise a pressure reducing means for keeping an interior of the chamber in a vacuum condition, whereby the solvent is removed from the coat by causing the solvent removal gas to flow from the center part toward the peripheral edge part of the workpiece while reducing an air pressure within the chamber.

This assures an accelerated drying of the thin film.

In the solvent removal apparatus of the present invention, it is preferred that the apparatus further comprise a heating means for heating the workpiece, whereby the solvent is removed from the coat by causing the solvent removal gas to flow from the center part toward the peripheral edge part of the workpiece while heating the workpiece with the heating means.

This assures an accelerated drying of the thin film.

In the solvent removal apparatus of the present invention, it is preferred that the apparatus further comprise a coat forming means for forming the coat on the workpiece.

This makes it possible to form a coat composed of a liquid phase film-forming material within a solvent removal apparatus, which eliminates the need to additionally and separately conduct such tasks as workpiece replacement, workpiece adjustment or the like during the course of forming the coat on the workpiece and subsequently removing the solvent from the coat. This reduces the number of working steps and results in an increased throughput (productivity). It also becomes possible to reduce the overall size of a system for performing the above processes.

In another aspect of the present invention, there is provided a solvent removal method, comprising the steps of: placing at a treatment position a workpiece provided with a liquid phase film-forming coat containing a film material and a solvent; and removing the solvent from the coat by causing a solvent removal gas to flow from the center part toward the peripheral edge part of the workpiece.

This helps to make uniform the thickness of the coat provided on the workpiece.

In a further aspect of the present invention, there is provided a solvent removal method for removing a solvent from a coat through the use of the solvent removal apparatus of the present invention, comprising the steps of: supporting a workpiece on a workpiece support means; and removing the solvent from the coat by causing a solvent removal gas to flow from a center part toward a peripheral edge part of the workpiece.

This helps to make uniform the thickness of the coat provided on the workpiece.

The above and other objects, features and advantages of the present invention will become apparent from the following description of preferred embodiments given in conjunction with the accompanying drawings, in which:

DETAILED DESCRIPTION OF THE PREFERRED EMBODIMENTS

Now, certain preferred embodiments of a solvent removal apparatus and a solvent removal method in accordance with the present invention will be described in detail with reference to the accompanying drawings.

Figure 1:
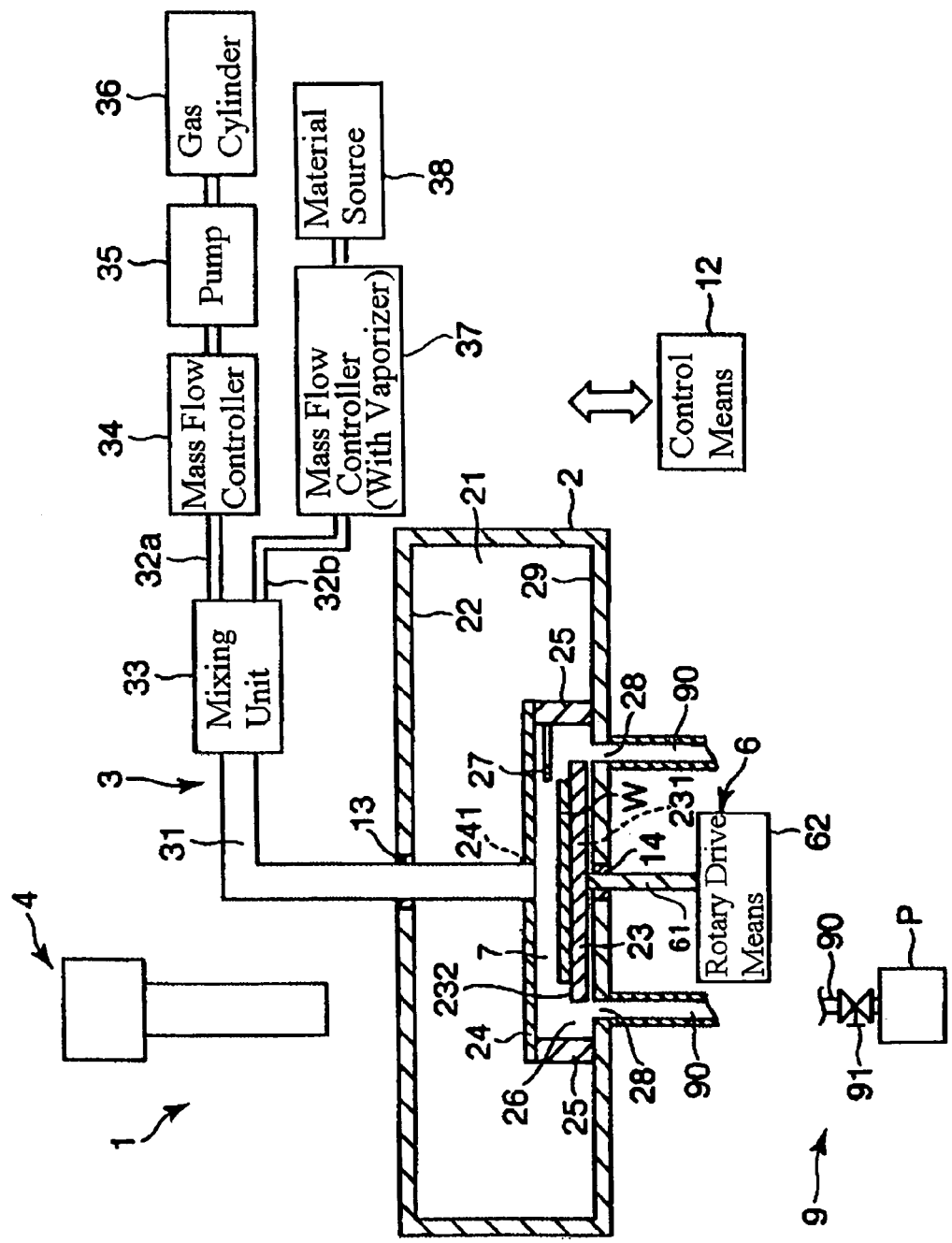
FIG. 1 is a side elevational section view illustrating a preferred embodiment of a solvent removal apparatus in accordance with the present invention.
Figure 2:
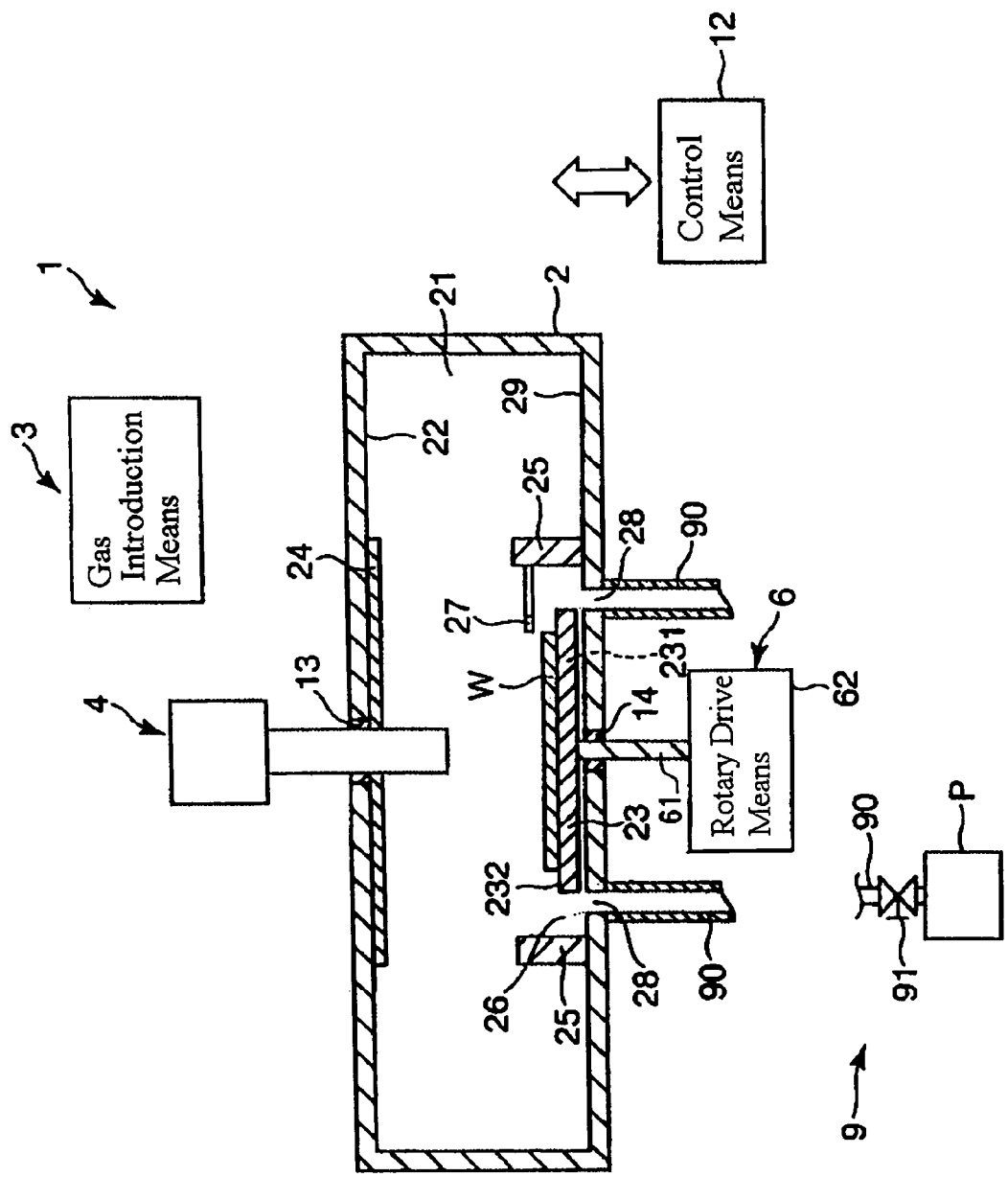
FIG. 2 is a side elevational section view illustrating a preferred embodiment of a solvent removal apparatus in accordance with the present invention.
Figure 3:
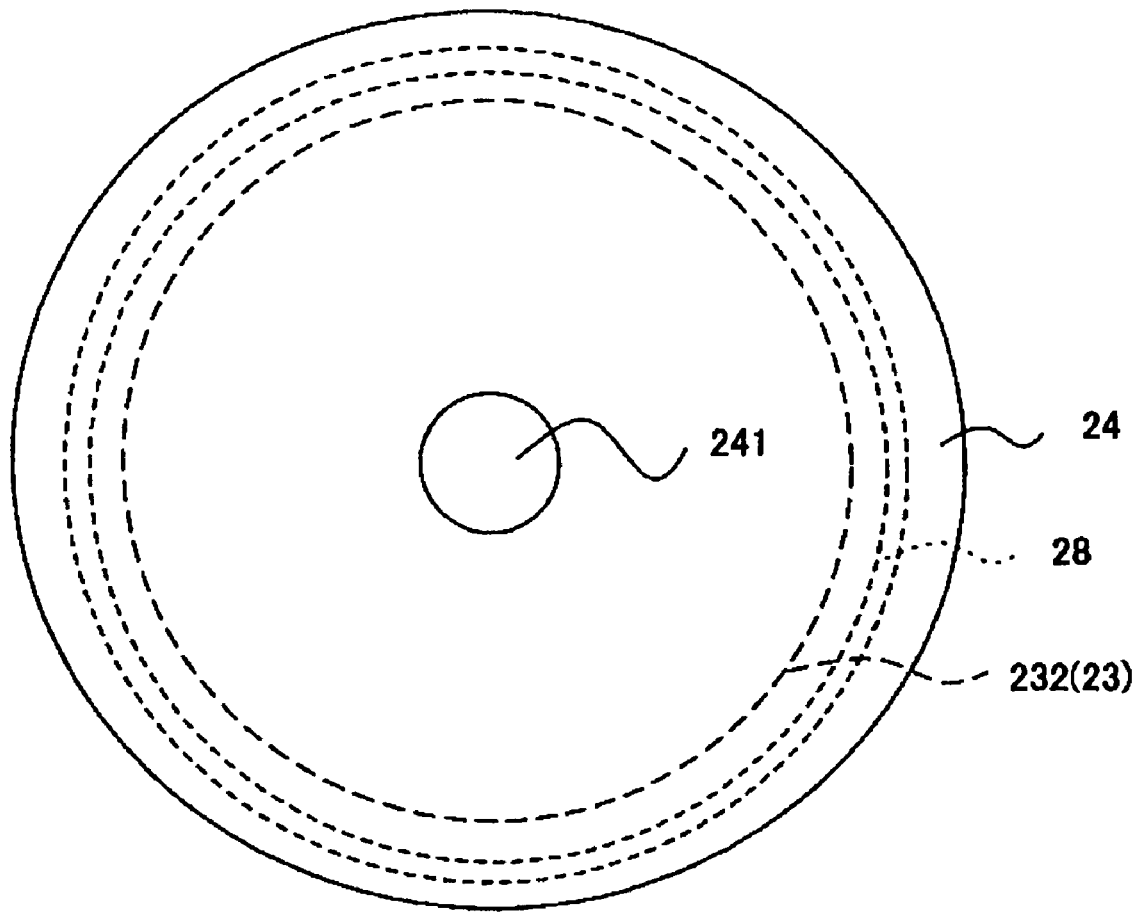
FIG. 3 is a top view showing a positional relationship of a support base, a confronting plate and an exhaust port in the apparatus illustrated in FIG. 1.

FIGS. 1 and 2 are side elevational section views illustrating preferred embodiments of a solvent removal apparatus in accordance with the present invention, whereas FIG. 3 is a top view showing a positional relationship of a support base, a confronting plate and an exhaust port in the apparatus illustrated in FIG. 1. As used herein below, the term "top" or its equivalents denotes the upper side, the term "bottom" or its equivalents represents the bottom side, the term "left" or its equivalents refers to the left side, and the term "right" or its equivalents means the right side, when viewed in FIGS. 1 and 2.

Referring first to FIG. 1, the solvent removal apparatus 1 includes a chamber (pressure reducing tank) 2, a gas introduction means 3, a coat forming means (dispensing unit) 4, a support base (workpiece support means) 23, a confronting plate 24 facing the support base 23, a side wall 25, a rotary drive means (displacing means) 6 for rotating the support base 23, a flow accelerating means 9 and a control means 12. Each of these components will be sequentially set forth below.

The solvent removal apparatus 1 is an apparatus that serves to remove an unnecessary solvent from a substrate W, one example of a workpiece, on the surface of which a coat of predetermined pattern is formed (provided) with a liquid phase film-forming material (ejected liquid) containing a film material, e.g., a resist material inclusive of a photoresist, and a solvent. As used herein, the term "thin film" denotes a coat or coat material from which a solvent has been removed.

While there exists no particular limitation in substances, shapes and dimensions of the substrate W used as a target object in the solvent removal apparatus 1, examples of the target object include a silicon (Si) substrate, a glass substrate, a metallic substrate, a resin substrate and a ceramics substrate. The substrate W is of plate-like configuration and has a generally circular shape when viewed from the top thereof.

The chamber 2 is a vessel that accommodates the substrate W and hermetically seals the interior space 21 within which the support base 23, the confronting plate 24, the side wall 25 and a gas sensor (detecting means) 27 are positioned in place.

The chamber is provided with an air-conditioning device not shown in the drawings that regulates or controls the temperature and the humidity within the interior space 21. The atmospheric condition in the interior space 21 of the chamber 2 is controlled by the air-conditioning device.

Additionally, the chamber 2 is provided with a door (shutter) not shown in the drawings through which the substrate W can be put into or taken out from the chamber 2.

Respectively connected to the chamber 2 are an exhaust pipe 90 and a gas introduction pipe 31 (gas introduction means 3). The exhaust pipe 90 is associated with a pump (flow accelerating means) and provides a path through which the gases are exhausted from the interior space 21. The gas introduction pipe 31 serves to introduce mixture gases (treatment gas for solvent removal) into the interior space 21.

The gas introduction means 3 is provided for the purpose of introducing the mixture gases toward the center part of the substrate W.

The mixture gases contain a mixed-in solvent which is either a solvent of the same kind as the in-coat solvent contained in the film-forming material deposited on the substrate W or a solvent of the property exercising substantially the same action as the mixed-in solvent with respect to the in-coat solvent contained in the film-forming material. It is desirable that the in-coat solvent has a high boiling point. As used herein, the term "high boiling point" refers to a boiling temperature ranging from about 110 degrees C. to 280 degrees C.

Throughout the specification and the claims, the term "mixed-in solvent" means a solvent in the vapor form that is admixed into the mixture gases, whereas the term "in-coat solvent" means a solvent originally contained in the coat with the film-forming material.

Use of the high boiling point solvent helps to suppress or avoid abrupt vaporization of the solvent on the substrate W which would otherwise occur in the heating process by a heater 231 described later. This assists in optimizing convection of the film material and thus making uniform the thickness of the dried thin film provided on the substrate W.

As for the mixture gases, detailed description will be offered later.

The flow rate of the mixture gases introduced toward the center part of the substrate W is preferably about 10-200 cc/min and more preferably about 50-300 cc/min, although the flow rate may be properly selected depending on the various conditions, e.g., the dimension of the substrate W used, the kind of the coat, the kind of the mixture gases and the like.

Regarding the gas introduction means 3, description will be made later.

A through-hole is formed on the top wall 22 of the chamber 2. The gas introduction pipe 31 is inserted through the through-hole and mounted in such a manner that it can be moved in an upward or downward direction in FIG. 1 with respect to the chamber 2. Fitted to the through-hole is a seal member (packing) 13 that isolates the interior from the exterior of the chamber 2, thus keeping the chamber 2 air-tight.

The support base 23 is provided for the purpose of supporting the substrate W. The support base 23 is of disk shape and fixedly secured at its center to a rotating shaft 61 of the rotary drive means 6.

The rotary drive means 6 includes a body part 62 provided outside the chamber 2 and the rotating shaft 61 of the rotary drive means 6 extends through a through-hole formed at the bottom of the chamber 2. A seal member (packing) 14 is fitted to the through-hole that receives the rotating shaft 61, thereby maintaining the chamber 2 air-tight. The body part 62 of the rotary drive means 6 incorporates therein an electric motor, a speed changing gadget and the like not shown in the drawings, and is adapted to rotatingly drive the support base 23 by way of the rotating shaft 61. Operational conditions of the rotary drive means 6 such as stoppage, driving, rotational speed and rotational angle are controlled by a control means 12.

The support base 23 has a top surface 232 (upper surface in FIG. 1) facing the confronting plate 24, which top surface is generally parallel to a horizontal reference plane.

Provided within the support base 23 is a heater (heating means) 231 that serves to heat the substrate W up to a desired temperature. In the below-noted solvent removal process, which removes an unnecessary solvent from the substrate W, the substrate W is heated by the heater 231 to vaporize the solvent from the coat. Heating the substrate W in this fashion makes it possible to optimize the flowability of the coat, which helps to acquire a thin film of uniform thickness.

In this case, the heating temperature of the substrate W is preferably about 30 to 150 degrees C. and more preferably about 35 to 80 degrees C. If the heating temperature is higher than the upper limit, the coat may be deteriorated in quality or solidified within a too shortened period of time. On the contrary, if the heating temperature is lower than the lower limit, the viscosity of the coat remains high, thereby resulting in decreased flowability of the coat and prolonged film production time. Moreover, there may happen such an instance that the thin film acquired shows irregularity in thickness.

The support base 23 has a plurality of apertures (not shown) on the top surface 232. A suction pump not shown in the drawings is connected to the support base 23 so that the substrate W can be suction-fixed to the top surface 232 of the support base 23 by the action of the suction pump.

As shown in FIG. 3, the confronting plate 24 is of disk shape and has a planar underneath surface (the lower surface in FIG. 1) that faces the support base 23. The confronting plate 24 has a size great enough to cover the whole substrate W, when viewed from the top of the apparatus, and is disposed in a confronting relationship with the support base 23 as noted above.

The space left between the confronting plate 24 and the substrate W or the support base 23 serves as a passageway 7 through which the gases flow along the face of the substrate W, i.e. substantially in parallel to the substrate W. The size of the passageway 7 in a vertical direction in FIG. 1, namely, the distance between the confronting plate 24 and the substrate W is preferably about 0.5-20 mm, more preferably about 1-5 mm and most preferably 2 mm.

As is apparent in FIG. 3, the confronting plate 24 has an opening 241 at its center. Detachably inserted through the opening 241 is the one end extension (the lower side in FIG.

1) of the gas introduction pipe 31. This assures that the bore of the opening 241 is in communication with the bore of the gas introduction pipe 31. The gases in the gas introduction pipe 31 are introduced toward the center part of the substrate W through the opening 241.

The confronting plate 24 can be displaced by an actuator mechanism not shown in the drawings in an upward or downward direction in FIG. 1 between a first position as illustrated in FIG. 1 and a second position as depicted in FIG. 2 where the confronting plate 24 does not interfere with the coat forming means.

The side wall 25 is of cylindrical shape (sleeve shape). As can be seen in FIG. 1, the side wall 25 has an outer diameter substantially equal to the diameter of the confronting plate 24 and is adapted to support the outer periphery of the confronting plate 24.

In the solvent removal process described below, the confronting plate 24 is placed at the first position, as illustrated in FIG. 1, where the confronting plate 24 is mounted or held on the side wall 25. On the other hand, in the below-noted coat forming process (the step of mounting the workpiece at a treatment position), the confronting plate 24 is placed at the second position, as illustrated in FIG. 2, where the confronting plate 24 remains released from the gas introduction pipe 31. In other words, at the second position, the confronting plate 24 is retreated to the ceiling of the chamber 2 and held in place by a holder means not shown in the drawings.

In order to displace the confronting plate 24 into the second position, it is necessary to disconnect the confronting plate 24 from the gas introduction pipe 31 in advance of such displacement.

As shown in FIGS. 1 and 3, an exhaust port (suction port) 28 of annular shape is formed on the bottom wall 29 of the chamber 2 to discharge the gases out of the chamber 2. Furthermore, the space provided between the side wall 25 and the outer periphery of the support base 23 serves as an outlet pathway 26 of annular configuration by way of which the mixture gases are led to the exhaust port 28.

The flow accelerating means 9 includes an exhaust pipe 90, a pump P for sucking the mixture gases and a flow passage opening-closing means (valve) 91 provided midway of the exhaust pipe 90. One end of the exhaust pipe 90 is connected to the exhaust port 28 of the chamber 2 so that the bore of the exhaust pipe 90 can be in communication with the exhaust port 28, while the other end of the exhaust pipe 90 is coupled to the pump P.

By the actuation of the pump P, the gaseous substances inclusive of the mixture gases introduced into the interior space 21 is discharged or exhausted from the chamber 2 to the outside via the exhaust port 28 and the exhaust pipe 90.

The flow passage opening-closing means 91 is capable of adjusting the degree of opening of the exhaust pipe 90 stepwise or continuously, thus regulating the flow rate of the mixture gases exhausted through the exhaust port 28 of the chamber 28. The flow passage opening-closing means 91 is actuated in response to signals from the control means 12.

It should be appreciated that the support base 23, the confronting plate 24 and the side wall 25 cooperate with one another to make up a major part of a restriction means for gas flow.

The restriction means serves to restrict the flowing direction of the mixture gases in such a manner that the mixture gases introduced by the gas introduction means 3 can flow radially outward along the face of the substrate W in the flow passageway 7 from the center part of the substrate W toward the peripheral edge part thereof.

At the time when the coat is dried in the manner set forth below, the mixture gases are introduced into the chamber 2 by means of the gas introduction means 3. On this occasion, as the pump P sucks up the mixture gases from the periphery side of the substrate W, a pressure differential is created between the center part and the peripheral edge part of the substrate. W. This helps to accelerate the flow of the mixture gases from the center part of the substrate W toward the peripheral edge part thereof.

The gas sensor 27 serves to detect concentration of a solvent (solvent vapor) contained in the mixture gases. This gas sensor 27 is provided in the vicinity of the peripheral edge (marginal end) of the substrate W so that it can detect the solvent concentration at a position adjacent to the substrate W. The gas sensor 27 is electrically associated with the control means 12.

As illustrated in FIGS. 1 and 2, the solvent removal apparatus 1 is designed to ensure that the coat forming means 4 can be interchanged with the gas introduction means 3 when shifting from the coat forming process to the solvent removal process, and vice versa. Such an interchanging operation is automatically performed by a mechanism not shown in the drawings.

Figure 5:
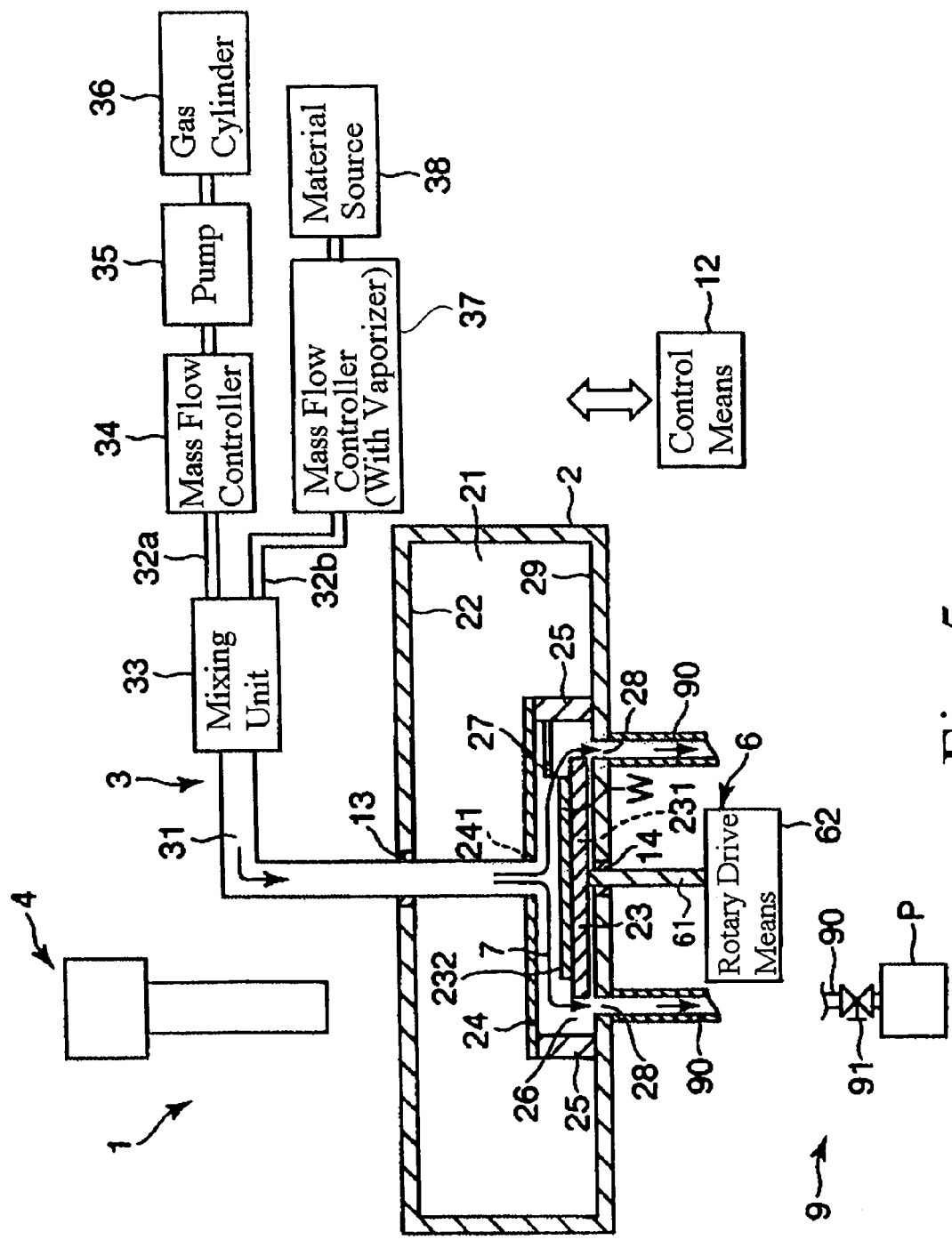
FIG. 5 is a side elevational section view illustrating a process of removing a solvent in a solvent removal apparatus in accordance with the present invention.

As can be seen in FIG. 2, the coat forming means 4 functions to form the coat on the substrate W in the coat forming process noted below and can be retreated to a prescribed position when conducting the solvent removal process as illustrated in FIG. 5.

Referring back to FIG. 1, the gas introduction means 3 includes a gas introduction pipe 31, a line 32a, a line 32b, a mixing unit 33, a mass flow controller (flow rate regulating means) 34, a pump 35, a gas cylinder 36, a mass flow controller 37 and a material source (reservoir) 38.

As illustrated in FIG. 1, the gas introduction pipe 31 is connected to the opening 241 of the confronting plate 24 at one end and to the mixing unit 33 at the other end. The line 32a is connected to the gas cylinder 36 at one end and to the mixing unit 33 at the other end. The line 32b is connected to the material source 38 at one end and to the mixing unit 33 at the other end.

The mass flow controller 34 and the pump 35 are disposed on the line 32a between the mixing unit 33 and the gas cylinder 36, whereas the mass flow controller 37 is disposed on the line 32b between the mixing unit 33 and the material source 38.

The gas cylinder 36 is filled with gas (referred to as "cylinder gas" herein below). The cylinder gas employed may be properly selected depending on the various conditions and purposes, e.g., the kinds of the materials for the liquid phase coat (film material, solvent and the like).

For the sole purpose of drying the coat, nitrogen gases and the air of low humidity (dry air), for example, can be used independently or in combination. For the purpose of drying and oxidizing the coat, oxygen gas or other gases with an increased oxygen concentration can be used by way of example. For the purpose of drying and reducing the coat, ammonia gas or other gases with an increased ammonia concentration can be used by way of example.

The pump 35 serves as a part of a supply means that supplies the cylinder gas in the gas cylinder 36 to the mass flow controller 34. If desired, the pump 35 may be eliminated.

The mass flow controller 34 is a device for regulating the flow rate of the cylinder gas. The mass flow controller 34 has an ability to supply a constant amount of the cylinder gas to the mixing unit 33 regardless of the pressure or other conditions of the cylinder gas at the inlet side thereof. The mass flow controller 34 is electrically connected to the control means 12.

The material source 38 stores a solvent in the interior thereof. This solvent (mixed-in solvent) is preferably of the same kind as the solvent (in-coat solvent) in the film-forming coat material deposited on the substrate W.

The mass flow controller 37 is a device for regulating the flow rate of the solvent supplied from the material source 38. The mass flow controller 37 has an ability to supply a constant amount of the solvent to the mixing unit 33 regardless of the pressure or quantity of the solvent at the inlet side thereof.

The mass flow controller 37 is provided with a vaporizer that converts the solvent from the material source 38 to a vapor (referred to as "mixed-in solvent vapor" herein below) before it is supplied to the mixing unit 33. The mass flow controller 37 is electrically connected to the control means 12.

The cylinder gas and the mixed-in solvent vapor supplied from the mass flow controller 34 and the mass flow controller 37 are admixed in the mixing unit 33 to have a generally uniform distribution of concentration, thus creating mixture gases. The mixture gases produced in the mixing unit 33 are introduced toward the center part of the substrate W in the chamber 2 through the gas introduction pipe 31.

The control means 12 serves to control the operations of each part of the apparatus, including the mass flow controllers 34, 37, the rotary drive means 6 and the flow passage opening-closing means 91. The control means 12 comprises a central processing unit (CPU) and a memory part that stores a variety of programs and data inclusive of a program for executing control operations of the solvent removal apparatus 1. In the illustrated embodiment, the control means 12 is disposed outside the chamber 2.

The control means 12 and the mass flow controller 34 are combined to make up a major part of a flow rate regulating means for regulating the flow rate of the cylinder gas. Likewise, the control means 12 and the mass flow controller 37 are combined to make up a major part of a ratio regulating means for regulating the ratio of the mixed-in solvent contained in the mixture gases.

Now, description will be made as for a solvent removal method, i.e., a method for removing the in-coat solvent from the coat deposited on the substrate W, which is performed by means of the solvent removal apparatus 1 described above.

First of all, under a state that the flow passage opening-closing means 91 remains closed, the door (shutter) is opened and then the substrate W is placed on the support base 23 through the use of a transfer means not shown in the drawings, after which the door is closed.

The substrate W is then aligned into a predetermined position on the support base 23 by the actuation of a substrate positioning device (not shown) incorporated in the solvent removal apparatus 1. Thereafter, the suction pump is operated to suction-fix the substrate W to the support base 23.

<Coat Forming Process>

Figure 4:
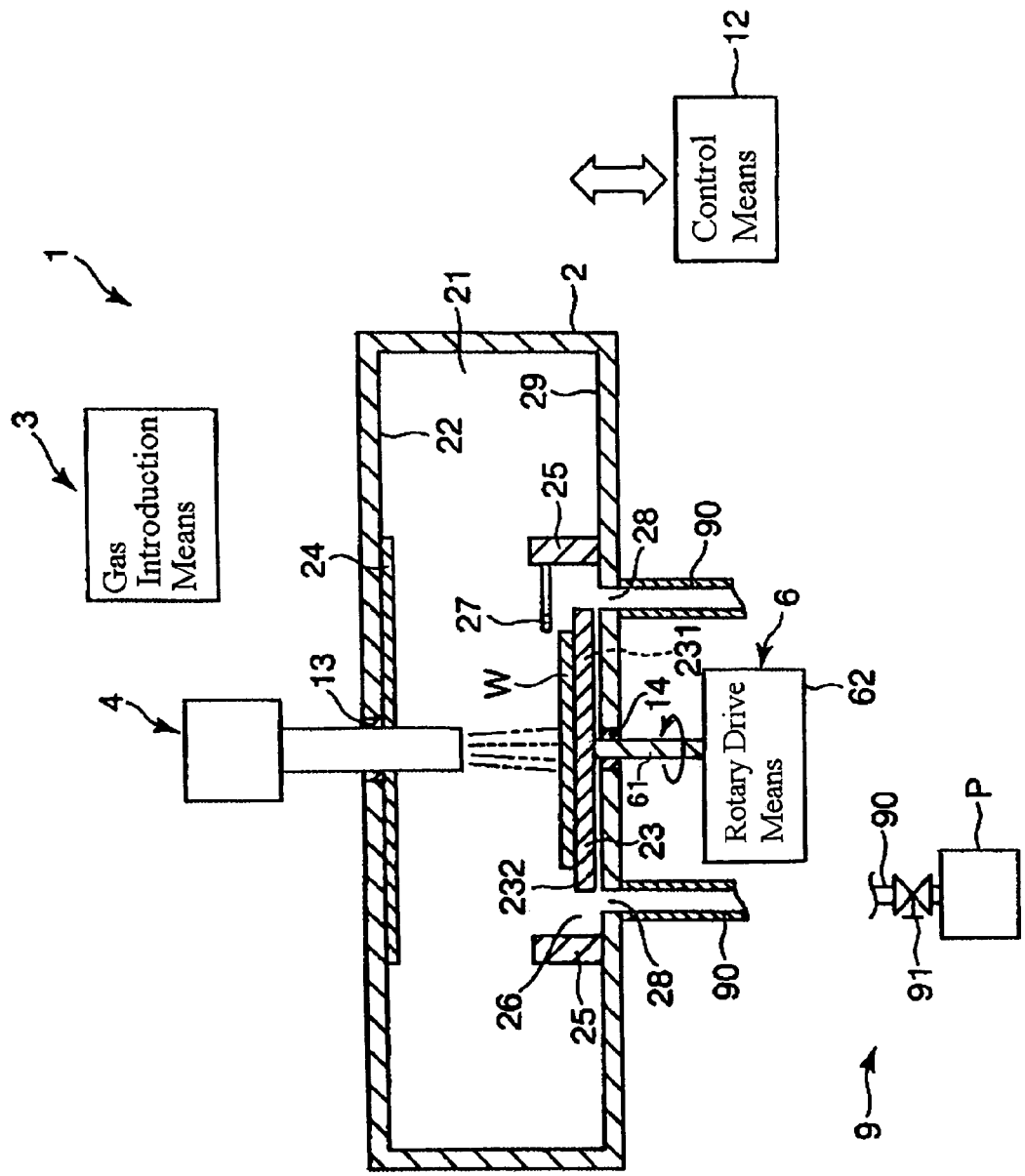
FIG. 4 is a side elevational section view illustrating a process of forming a coat in a solvent removal apparatus in accordance with the present invention.

Subsequently, as illustrated in FIG. 4, the coat forming means 4 is mounted above the substrate W and a liquid phase film-forming material is dropped on the top surface of the substrate W. Then, a coat of the film-forming material is formed on the substrate W by making use of a spin coating method. More specifically, the support base 23 is rotated by means of the rotary drive means 6 so that the film-forming material can be spread over the substrate W with a pre-defined thickness, while causing the surplus of the film-forming material to fly away, thereby forming the coat.

Then, the coat forming means 4 is retreated from the chamber 2 and, instead, the gas introduction means 3 and the confronting plate 24 are mounted to dispose to the prescribed positions. This terminates the process of preparation for treatment of the substrate (workpiece) W.

<Solvent Removal Process>

At first, the substrate W is heated by means of the heater 231 to hereby heat up the coat formed on the substrate W in the preceding process.

Subsequently, the mixture gases are introduced toward the center part of the substrate W through the gas introduction pipe 31. Almost concurrently with the introduction of the mixture gases, the flow passage opening-closing means 91 is opened and the pump P is actuated to draw the atmospheric gases in the chamber 2 from the periphery of the substrate W.

In this process, if the mixture gases make contact with the coat on the substrate W, the in-coat solvent is discharged or vaporized from the contacted part of the coat by the action of the mixture gases, whereby the task of drying the coat, namely, removing the in-coat solvent from the coat, proceeds.

This ensures that the coat on the center part of the substrate W begins to dry in the first place by the solvent removing action of the mixture gases. The mixture gases continue to flow along the flow passageway 7 radially outward from the center part toward the peripheral edge part of the substrate W. Accordingly, the in-coat solvent contained in the coat of the substrate W is removed sequentially from the center part toward the peripheral edge part of the substrate W.

As the mixture gases come closer to the peripheral edge part of the substrate W, the concentration of the solvent vapor in the mixture gases, i.e., the ratio of the solvent vapor (vaporized in-coat solvent) with respect to the total gases is gradually increased. This gradually reduces the amount of the in-coat solvent removed from the coat on the substrate W by the mixture gases.

After all, the mixture gases arrive at the peripheral edge part (marginal end) of the substrate W. The flow rate of the mixture gases is controlled in such a manner that the mixture gases are supplied in a greatest possible quantity to make themselves saturated at the marginal end with the vaporized in-coat solvent, namely, to maximize the concentration of the solvent contained in the mixture gases up to the saturation concentration. This control method (a first control method) will be described later in detail.

Thereafter, the mixture gases are led to the exhaust pipe 90 via the outlet pathway 26 and the exhaust port 28 and eventually exhausted to the outside of the chamber 2.

In this manner, the in-coat solvent is removed from the coat on the substrate W.

Once the task of drying the substrate W comes to an end, the introduction of the mixture gases is stopped and the door of the chamber 2 is opened to allow the transfer means noted above to take out the substrate W from the chamber 2, after which the next substrate W is placed into the chamber 2.

Figure 6:
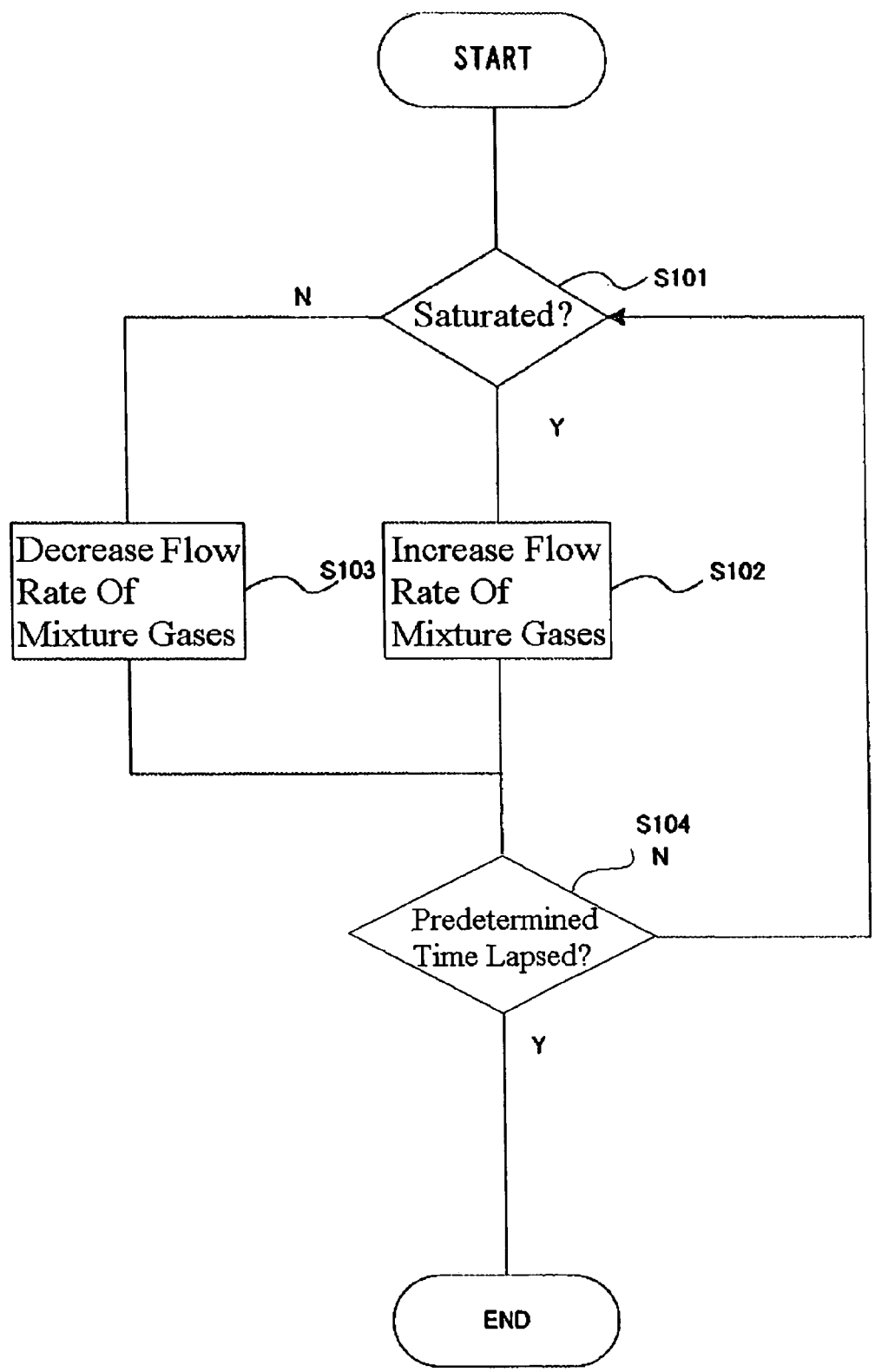
FIG. 6 is a flowchart showing a first control method employed in the present invention.

FIG. 6 is a flowchart showing the first control method referred to above. The method of controlling the flow rate of the mixture gases (first control method) will now be set forth with reference to FIG. 6.

Initially, responsive to the detection result in the gas sensor 27, determination is made as to whether the mixture gases are saturated with the solvent (step S101).

If the mixture gases are in a saturated condition (the answer at step S101 is affirmative), it is judged that the flow rate of the mixture gases is too small and the mass flow controllers 34 and 37 operate so as to increase the flow rate of the cylinder gas and the solvent vapor that the gas cylinder 36 and the material source 38 supply to the mixing unit 33 (step S102). Thereafter, the flow proceeds to step S104.

On the contrary, if the mixture gases are not in the saturated condition (the answer at step S101 is negative), it is judged that the flow rate of the mixture gases is too much and the mass flow controllers 34 and 37 operate so as to decrease the flow rate of the cylinder gas and the solvent vapor that the gas cylinder 36 and the material source 38 supply to the mixing unit 33 (step S103). Thereafter, the flow proceeds to step S104.

Then, determination is made as to whether a predetermined time has lapsed (step S104). If the predetermined time has lapsed (the answer at step S104 is affirmative), it is judged that the task of drying the coat was completed, thus terminating the solvent removal process. In the meantime, if the predetermined time has not yet lapsed (the answer at step S104 is negative), the operation flow is returned back to step S101 so that the steps followed by step S101 can be executed in the same manner as noted above.

Figure 7:
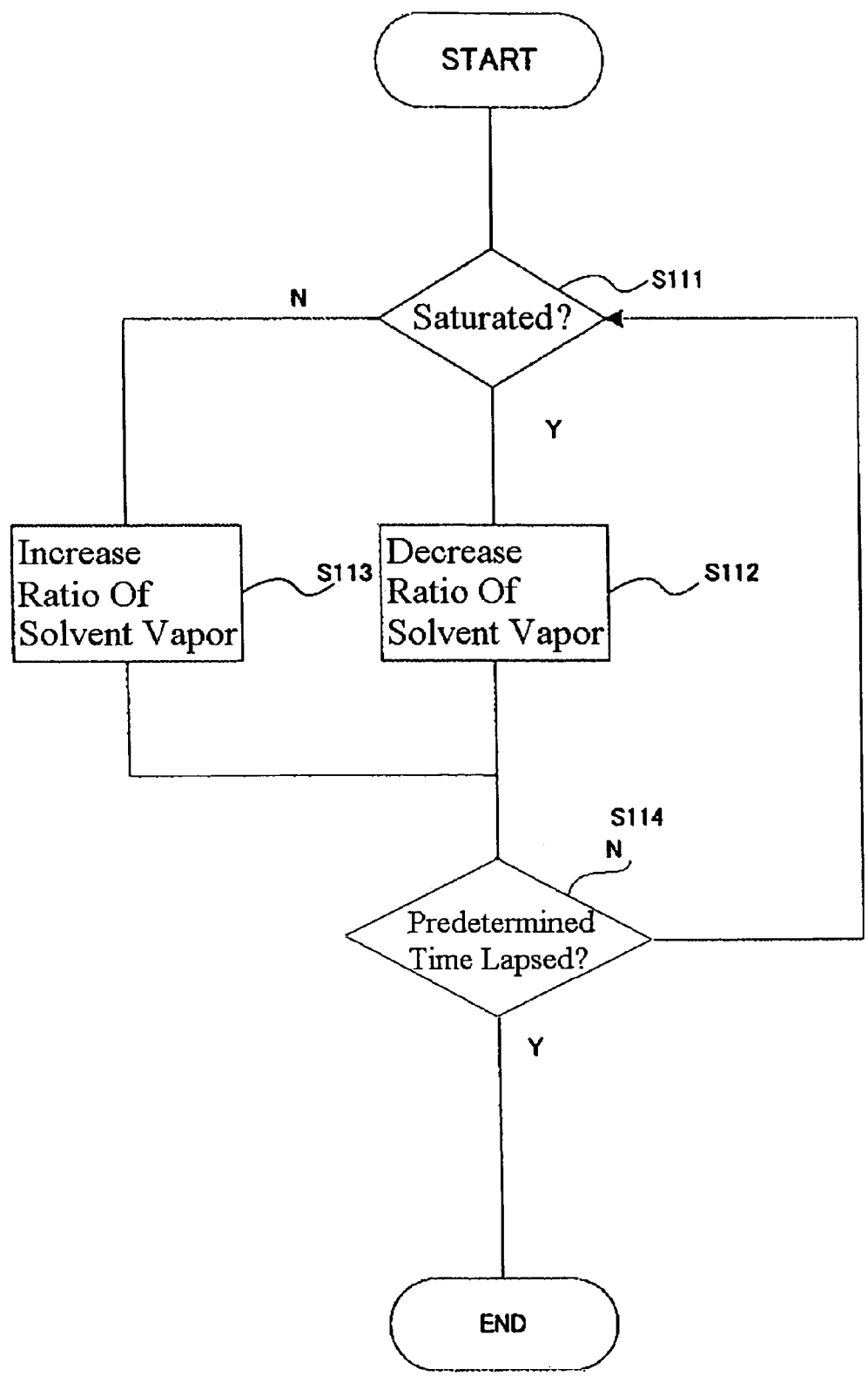
FIG. 7 is a flowchart showing a second control method employed in the present invention.

FIG. 7 is a flowchart showing a second control method employed in the present invention. The second control method will now be described in respect of the solvent removal process. In the following description, a focus is placed on the parts of the second control method that differ from the afore-mentioned first control method (the method of controlling the flow rate of the mixture gases). No description is offered regarding the same parts.

The second control method differs from the first control method in that the former controls the ratio of the solvent vapor (mixed-in solvent) contained in the mixture gases.

According to the second control method, the ratio of the mixed-in solvent in the mixture gases is controlled in such a manner that, when arrived at the peripheral edge part (marginal end) of the substrate W, the mixture gases are converted from a condition not yet saturated with the in-coat solvent to a condition fully saturated with the vaporized in-coat solvent. In other words, the ratio of the mixed-in solvent in the mixture gases is controlled so that the solvent concentration in the mixture gases can be increased to eventually saturate the mixture gases with the solvent at the peripheral edge part of the substrate W.

Now, the second control method will be described in detail with reference to the flowchart shown in FIG. 7.

At first, responsive to the detection result in the gas sensor 27, determination is made as to whether the mixture gases are saturated with the solvent (step S111).

If the mixture gases are in a saturated condition (the answer at step S111 is affirmative), it is judged that the ratio of the mixed-in solvent in the mixture gases is too high and the mass flow controller 37 is controlled so as to decrease the quantity of the mixed-in solvent vapor supplied to the mixing unit 33, thus lowering the ratio of the mixed-in solvent in the mixture gases (step S112). Thereafter, the flow proceeds to step S114.

On the contrary, if the mixture gases are not in the saturated condition (the answer at step S111 is negative), it is judged that the ratio of the mixed-in solvent in the mixture gases is too low and the mass flow controller 37 is controlled so as to increase the quantity of the mixed-in solvent vapor supplied to the mixing unit 33, thus raising the ratio of the mixed-in solvent in the mixture gases (step S113). Thereafter, the flow proceeds to step S114.

Then, determination is made as to whether a predetermined time has lapsed (step S114). If the predetermined time has lapsed (the answer at step S114 is affirmative), it is judged that the task of drying the coat was completed, thus terminating the solvent removal process. In the meantime, if the predetermined time has not yet lapsed (the answer at step S114 is negative), the flow is returned back to step S111 so that the steps followed by step S111 can be executed in the same manner as noted above.

The second control method provides the same beneficial effect as attainable in the first control method described in the foregoing.

Alternatively, the solvent concentration control may be performed through the combined use of the features of the first and second control methods.

As described above, the solvent removal method of the present invention ensures that the drying speed of the coat by the supply of solvent removal gas is kept smaller at the peripheral edge part of the substrate (workpiece) than or substantially equal to the drying speed of the coat at the center part.

Due to the fact that the peripheral edge part of the substrate W has a broader exposure portion (surface area) than the center part thereof, the coat drying speed at the peripheral edge part tends to become greater than that at the center part, if the mixture gases are not blown on the substrate W.

According to the present embodiment, as the mixture gases come closer to the peripheral edge part of the substrate W, the concentration of the solvent vapor in the mixture gases, i.e., the ratio of the solvent vapor with respect to the total gases is gradually increased as set forth above. This gradually reduces the amount of the in-coat solvent removed from the coat on the substrate W by the mixture gases. Specifically, the mixture gas-caused coat drying speed per area at the peripheral edge part becomes smaller than the mixture gas-caused coat drying speed per area at the center part.

As a consequence, the entire coat on the substrate W is dried substantially uniformly (almost at an equal drying speed) and the gradient of concentration of the coat in the drying process goes reduced or mitigated. This helps to prohibit the solvent or other film materials from moving between the center part and the peripheral edge part.

Thus, the resultant film on the substrate W has an improved flatness (substantially uniform thickness).

Furthermore, the mixed-in solvent vapor contained in the mixture gases helps to avoid any over-drying of the coat particularly at the center part of the substrate W.

In addition, if there is a need to change the coat drying speed depending on the physical properties of the film-forming material, such change can be easily made by altering the flow rate of the mixture gases or the ratio of the mixed-in solvent vapor in the mixture gases under a control of the control means 12. This makes it possible to attain an optimized drying speed without having to change the structure (hardware specification) of the solvent removal apparatus 1.

Moreover, according to the solvent removal apparatus 1 of the present invention, the thickness uniformity of the film can be enhanced by detecting the solvent concentration in the mixture gases at the peripheral edge part of the substrate W with the gas sensor (detecting means) 27 and then, responsive to the result of detection, arbitrarily changing or feed-back controlling the flow rate of the mixture gases introduced or the concentration of the mixed-in solvent vapor in the mixture gases. Use of the cylinder gas and the mixed-in solvent vapor in an optimized quantity helps to improve the efficiency of utilization of the cylinder gas and the mixed-in solvent vapor.

Since the processes for forming and drying the coat can be conducted in the solvent removal apparatus 1, it becomes possible to reduce the laborious efforts which would otherwise be involved in replacing and positioning a workpiece. This helps to improve the throughput or productivity.

Owing to the fact that the temperature and the humidity in the interior space 21 is managed by the chamber 2, it is possible to eliminate errors which would otherwise occur by the temperature change-induced expansion and retraction of the substrate W and various components of the apparatus. Furthermore, foreign matters such as dirt and dust are prevented from intruding into the interior space 21, which assists in keeping the substrate W clean.

The solvent removal apparatus and method of the present invention can cope, in the same manner as noted above, with the situation that the coat is dried faster at the peripheral edge part of the substrate W than at the center part due to other factors, e.g., elevated temperature at the peripheral edge part of the substrate W.

Although the solvent removal apparatus and method of the present invention has been described with reference to the illustrated embodiments, it should be understood that the invention is not limited to the illustrated embodiments but many modifications may be made to the respective elements while keeping their functions the same. Also, other optional elements may be added to the apparatus and method of the present invention.

Moreover, while the coat is formed by the spin coating method in the embodiments shown and described above, the coat formation method is not limited to the spin coating method but may include, for example, a DIP coating method, a roll coating method and a spray coating method.

Additionally, while the coat is dried with the aid of the heater (hot plate) 231 in the afore-mentioned embodiments, the drying method is not limited to this but may include, for example, a method of drying the coat by irradiation of infrared rays or microwaves and a method of drying the coat under a vacuum condition of the interior space 21. These methods may be employed in combination to dry the coat.

Particularly, it is desirable that, in case of using the high boiling point solvent as noted above, the task of heating the substrate W in the solvent removal process be performed under a vacuum condition, i.e., under a condition that the pressure within the chamber 2 is reduced. This helps to shorten the time taken in producing the substrate W.

In this case, the degree of pressure reduction, namely, the pressure within the chamber 2 (kept in a heated atmosphere) may be properly regulated depending on the kind of the solvent used. This further enhances the time saving effect referred to just above.

Although the confronting plate 24 is of generally disk-like shape in the embodiments described above, it would be possible to arbitrarily change the shape of the confronting plate 24 to fit with a variety of processes, depending on the shape of the substrate W used, the thickness of the film-forming material coat provided on the substrate W and the like.

Likewise, the gas introduction means 3 is not limited to the one of the illustrated embodiment but may be composed to draw the gases (atmospheric gases) from the chamber 2 and inject them back into the chamber 2 after dilution.

Although the mixture gases used for solvent removal in the above embodiments contain the same kind of solvent as the solvent contained in the film-forming material of the coat deposited on the surface of the substrate W, it would be possible, for example, to use the cylinder gas alone for the purpose of solvent removal without having to admix the solvent.

In the solvent removal apparatus of the present invention, the coat forming means may be eliminated in its entirety. Also, the substrate (workpiece) processed in the present invention is not limited to the plate-like member.

The solvent removal apparatus and method of the present invention is not particularly limited to the use as described above but may be applicable in conducting the task of drying in a liquid phase process for producing electronic devices such as displays, semiconductors and the like, where use is made of liquid materials (including a dispersion liquid such as a suspension and an emulsion) that contain, in addition to a resist, the following materials for example:

Light-emitting materials for use in forming an electroluminescence (EL) light-emitting layer in an organic EL device; Fluorescent materials for use in forming a fluorescent member on an electrode of an electron emission device; Fluorescent materials for use in forming a fluorescent member in a plasma display panel (PDP) device; Migration materials for use in forming a migration member in an electrophoresis display device; Bank materials for use in forming a bank on the surface of a substrate W; Various kinds of coating materials; Liquid phase electrode materials for use in forming an electrode; Particulate spacer materials for creating a minute, gap between a pair of substrates; Liquid phase metallic materials for forming a metal wiring; Lens materials for forming a micro-lens; Ink materials including a filter material for a color filter; and Light diffusion materials for use in forming a light diffusion member.

Although preferred embodiments of the present invention have been set forth in the foregoing, it will be apparent to those skilled in the art that various changes or modifications may be made thereto within the scope of the invention defined by the appended claims.

What is claimed is:

1. A solvent removal apparatus, comprising:
   a workpiece support unit that supports a workpiece;
   a chamber that accommodates the workpiece support unit together with the workpiece and controls an atmospheric condition within the chamber, the chamber having a top wall having a throuh-hole;
   a coat forming unit that introduces a liquid phase film-forming material containing a film material and a solvent onto the workpiece through the through-hole to form a coat of the liquid phase film-forming material on the workpiece;
   a gas introduction unit that introduces a solvent removal gas containing solvent vapor toward a center part of the workpiece through the through-hole, the solvent removal gas being used to remove the solvent contained in the coat; and
   a restriction unit that restricts flow of the solvent removal gas so that the solvent removal gas flows radially outward from the center part of the workpiece toward a peripheral edge part of the workpiece,
   wherein the solvent is removed from the coat while restricting the flow of the solvent removal gas with the restriction unit.

2. The apparatus as recited in claim 1, wherein the restriction unit comprises a confronting plate having an opening through which the solvent removal gas is introduced from the gas introduction unit, the confronting plate disposed in a confronting relationship with the workpiece so that the solvent removal gas flows through a flow passageway formed between the confronting plate and the workpiece.

3. The apparatus as recited in claim 2, wherein the confronting plate is configured to cover the workpiece, when viewed from atop the apparatus.

4. The apparatus as recited in claim 1, wherein the restriction unit comprises a flow accelerating unit that facilitates the radial gas flow by augmenting an air pressure differential between the center part and the peripheral edge part of the workpiece.

5. The apparatus as recited in claim 1, wherein the solvent removal gas introduced toward the center part of the workpiece contains a mixed-in solvent from which the solvent vapor is produced.

6. The apparatus as recited in claim 1, further comprising:
a detecting unit that detects the solvent vapor concentration in the solvent removal gas at a predetermined position between the center part and the peripheral edge part of the workpiece; and
a flow rate regulating unit that is responsive to the result of detection in the detecting unit for regulating a flow rate of the solvent removal gas introduced toward the center part of the workpiece.

7. The apparatus as recited in claim 6, wherein the flow rate regulating unit is adapted to regulate the flow rate of the solvent removal gas introduced toward the center part of the workpiece so that the solvent removal gas is supplied in a greatest possible quantity to keep itself saturated with the vaporized solvent removed from the coat, when the solvent removal gas arrives at the peripheral edge part of the workpiece.

8. The apparatus as recited in claim 1, further comprising:
a detecting unit that detects the solvent vapor concentration in the solvent removal gas at a predetermined position between the center part and the peripheral edge part of the workpiece; and
a ratio regulating unit that is responsive to the result of detection in the detecting unit for regulating a ratio of the solvent vapor in the solvent removal gas introduced toward the center part of the workpiece.

9. The apparatus as recited in claim 8, wherein the ratio regulating unit is adapted to regulate the ratio of the solvent vapor in the solvent removal gas introduced toward the center part of the workpiece so that, when the solvent removal gas arrives at the peripheral edge part of the workpiece, the solvent removal gas is converted from a not yet saturated condition with the vaporized solvent to a fully saturated condition with the vaporized solvent.

10. The apparatus as recited in claim 6, wherein the detecting unit is adapted to detect the solvent vapor concentration in the solvent removal gas at a position in the vicinity of the peripheral edge part of the workpiece.

11. The apparatus as recited in claim 1, further comprising a pressure reducing unit that keeps an interior of the chamber in a vacuum condition, wherein the solvent is removed from the coat by causing the solvent removal gas to flow from the center part toward the peripheral edge part of the workpiece while reducing an air pressure within the chamber by the pressure reducing unit.

12. The apparatus as recited in claim 1, further comprising a heating unit that heats the workpiece, wherein the solvent is removed from the coat by causing the solvent removal gas to flow from the center part toward the peripheral edge part of the workpiece while heating the workpiece with the heating unit.

13. A solvent removal method, comprising the steps of:
preparing a solvent removal gas by mixing solvent vapor and a cylinder gas;
placing a workpiece at a treatment position;
forming a coat of a liquid phase film-forming material containing a film material and a solvent on the workpiece; and
removing the solvent from the coat by causing the solvent removal gas containing the solvent vapor to flow from a center part of the workpiece toward a peripheral edge part of the workpiece, wherein the solvent removal gas removes the solvent contained in the coat.

14. A solvent removal method for removing the solvent from the coat formed on the workpiece through the use of the solvent removal apparatus as recited in claim 1, comprising the steps of:
preparing the solvent removal gas by mixing the solvent vapor and a cylinder gas;
supporting a workpiece on the workpiece support unit;
forming the coat by introducing the liquid phase film-forming material containing the film material and the solvent to the workpiece; and
removing the solvent from the coat by causing the solvent removal gas to flow from the center part toward the peripheral edge part of the workpiece.

15. A solvent removal apparatus, comprising:
a workpiece support member which supports a workpiece;
a chamber which accommodates the workpiece support member together with the workpiece and controls an atmospheric condition within the chamber, the chamber having a top wall including a through-hole;
a coat forming system which introduces a liquid phase film-forming material containing a film material and a solvent onto the workpiece through the through-hole to form a coat of the liquid phase film-forming material on the workpiece;
a gas introduction system which provides a solvent removal gas containing solvent vapor to the workpiece through the through-hole, the solvent removal gas being used to remove the solvent contained in the coat; and
a gas restriction member which restricts the solvent removal gas so as to flow radially from a center part of the workpiece to a peripheral edge part of the workpiece along the workpiece.

16. A method of drying a coat comprising a film material and a solvent, provided on a workpiece, comprising:
preparing a solvent removal gas by mixing solvent vapor and a cylinder gas; and
jetting the solvent removal gas containing the solvent vapor to the coat to remove the solvent contained in the coat, while
restricting the solvent removal gas so as to flow radially from a center part of the workpiece to a peripheral edge part of the workpiece along the workpiece.

17. The apparatus as recited in claim 1, wherein the gas introduction unit comprises:
a mixing unit that mixes the solvent vapor and a cylinder gas;
a first flow rate regulating unit that regulates the flow rate of the cylinder gas; and a second flow rate regulating unit that regulates the flow rate of the solvent vapor.

18. The apparatus as recited in claim 17, wherein the second flow rate regulating unit is provided with a vaporizer that converts a solvent material source to the solvent vapor.

19. The apparatus as recited in claim 2, wherein the restriction unit further comprises a side wall supporting the confronting plate and surrounding the workpiece support unit.

20. The apparatus as recited in claim 2, wherein the restriction unit further comprises an actuator mechanism adapted to displace the confronting plate in a direction perpendicular to the workpiece.

21. The apparatus as recited in claim 1, wherein the vapor solvent has a high boiling point with respect to the solvent contained in the coat.

22. The apparatus as recited in claim 1, further comprising an interchanging mechanism that automatically interchanges the coat forming unit and the gas introduction unit.

* * * * *